United States Patent [19]

Kinsman

[11] 4,423,394
[45] Dec. 27, 1983

[54] MULTIPLE POLE BANDPASS FILTER HAVING MONOLITHIC CRYSTAL ELEMENTS

[75] Inventor: Robert G. Kinsman, Naperville, Ill.
[73] Assignee: Motorola, Inc., Schaumburg, Ill.
[21] Appl. No.: 803,903
[22] Filed: Jun. 6, 1977
[51] Int. Cl.³ .............. H03H 9/52; H03H 9/56; H03H 9/60
[52] U.S. Cl. ................. 333/192; 310/320; 333/191
[58] Field of Search .......... 333/72, 71, 187–192; 310/314, 320, 317, 318

[56] References Cited

U.S. PATENT DOCUMENTS 4,028,647 6/1977 Yee ................... 310/321 X

Primary Examiner—Marvin L. Nussbaum
Attorney, Agent, or Firm—Mark P. Kahler; Edward M. Roney; James W. Gillman

[57] ABSTRACT

A symmetrical two pole monolithic crystal filter is combined with appropriate value fixed capacitors and cascaded with other similar filter elements to provide a high order filter with symmetrical transmission zeros and low passband ripple. The filter includes a piezoelectric resonating element having first and second opposite sides with first and second pairs of electrodes thereon. A first capacitor is coupled to an electrode of the first pair located on the first side and a second capacitor is coupled to an electrode of the second pair of the electrodes located on the first side. A shunting capacitor is used between the electrodes of the first and second pairs located on the first side. A fourth capacitor is coupled from both of the first and second electrodes located on the second side.

12 Claims, 6 Drawing Figures

U.S. Patent  Dec. 27, 1983  4,423,394
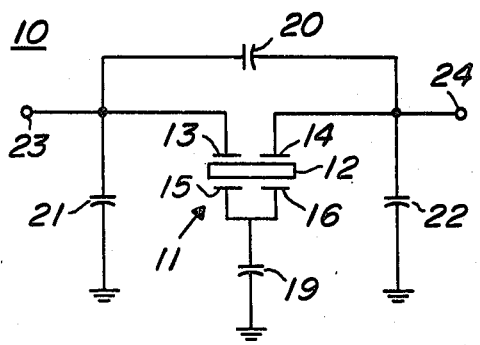
_Fig.1_
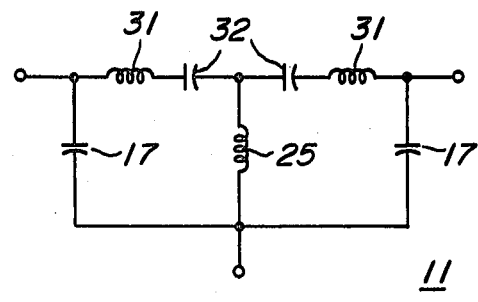
_Fig.2_
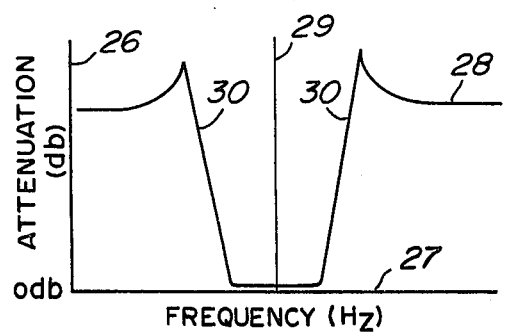
_Fig.3_
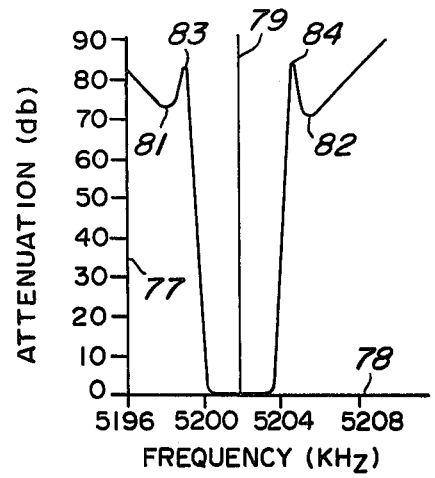
_Fig.6_
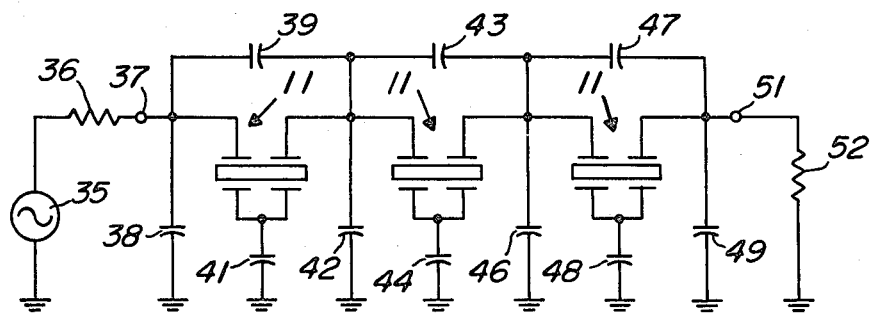
_Fig.4_
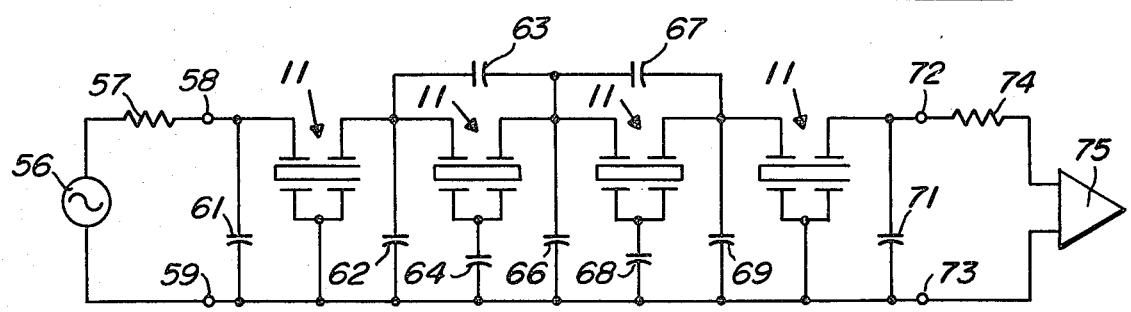
_Fig.5_

MULTIPLE POLE BANDPASS FILTER HAVING MONOLITHIC CRYSTAL ELEMENTS

BACKGROUND OF THE INVENTION

This invention relates, in general, to filters and more particularly, to multiple pole filters with symmetrical transmission zeros having monolithic crystal elements.

One of the largest applications of crystal filters is in the communications industry where they are used in single sideband radios. They are well suited for this type of application because of their small size, excellent frequency stability characteristics, and low manufacturing costs. They are passive components and therefore require no power. Monolithic crystal filters are typically of the all pole type. However, occasions arise where more system attenuation is required in the stopband. In the past this has been accomplished by use of elaborate electrode patterns on the monolithic filter element itself or by using additional crystals as trap elements to provide transmission zeros. However, these techniques are costly either by increasing manufacturing costs or increasing costs from the use of additional elements.

Accordingly, an object of the present invention is to provide an improved multiple pole crystal filter.

Another object of the present invention is to provide a high order filter with symmetrical transmission zeros and low passband ripple with the use of only simple two pole symmetrical monolithic crystal filter elements and fixed capacitors.

Yet another object is to provide a filter of a desired frequency response which is obtained with simple, two pole filter elements and capacitors only, thereby giving minimum insertion loss and maximum temperature stability at a minimum cost.

SUMMARY OF THE INVENTION

In carrying out the above and other objects of the invention in one form, there is provided an improved crystal filter having a cascade of two pole monolithic crystal filter elements plus appropriately chosen fixed capacitors to generate symmetrical transmission zeros. The two pole filter element includes a resonating element having first and second opposite sides with first and second pairs of electrodes thereon. The electrodes of each pair are on opposite sides of the resonating element. Means are coupled to the first pair of electrodes for applying signals thereto and means can be coupled to the second pair of electrodes for deriving selected signals therefrom. A first capacitor is coupled to an electrode of the first pair located on the first side and a second capacitor is coupled to an electrode of the second pair of electrodes located on the first side. A third capacitor is coupled between the electrodes of the first and second pairs of the electrodes located on the first side. The electrodes of the first and second pairs located on the second side are coupled together and to a fourth capacitor.

The subject matter which is regarded as the invention is set forth in the appended claims. The invention itself, however, together with further objects and advantages thereof, may be better understood by referring to the following detailed description taken in conjunction with the accompanying drawings.

BRIEF DESCRIPTION OF THE DRAWINGS

FIG. 1 is a diagram of a two pole, two zero filter element;

FIG. 2 is a schematic of the equivalent components of a portion of the filter illustrated in FIG. 1;

FIG. 3 is an attenuation versus frequency response curve of the filter of FIG. 1;

FIG. 4 is a cascade of the filter illustrated in FIG. 1 to provide a six pole, six zero filter;

FIG. 5 is a diagram of a cascade of filter elements to provide an eight pole, four zero filter; and FIG. 6 is an attenuation versus frequency response curve of the filter illustrated in FIG. 5.

The exemplifications set out herein illustrate the preferred embodiments of the invention in one form thereof, and such exemplifications are not to be construed as limiting in any manner.

DESCRIPTION OF THE PREFERRED EMBODIMENTS

Referring now to FIG. 1, there is shown a two pole, two zero filter element 10 having a resonating element 11. Resonating element 11 has a wafer 12 which can be made of quartz or any other suitable piezoelectric material which has two resonating portions. The two resonating portions have associated therewith a pair of electrodes which are, of course, acoustically coupled to each other. Electrodes 13 and 15 comprise a first pair of electrodes and electrodes 14 and 16 comprise a second pair of electrodes. Electrodes 15 and 16 which are on one side of resonator or resonating element 11 are interconnected and are coupled to a reference potential or ground by capacitor 19. Electrode 13 is coupled to the reference potential by capacitor 21 while electrode 14 is coupled to the reference potential by capacitor 22. A shunting capacitor 20 is coupled between electrodes 13 and 14. An input terminal 23 is connected to electrode 13 and an output terminal 24 is connected to electrode 14.

Resonating element 11 is illustrated in FIG. 2 by its equivalent circuit components and it preferably takes the form of a dual-coupled monolithic crystal filter element. Capacitors 17 represent the electrode capacitance. This capacitance is sometimes referred to as a static capacitance because it is a result of the physical relationship between the electrodes and the quartz wafer. Capacitors 17 are caused by electrodes 13 and 15, and electrodes 14 and 16. A first inductor 31 is in series with a first capacitor 32 and are both in series with a second capacitor 32 and a second inductor 31. An inductor 25 is connected at one end between a junction formed by capacitors 32. The other end of inductor 25 is connected to a common connection of capacitors 17. The equivalent components of resonating element 11 are well known to those skilled in the art and are shown here only to assist in better understanding the present invention.

Curve 28 FIG. 3 is an attenuation versus frequency response curve for the filter illustrated in FIG. 1. Frequency in Hertz is measured along ordinate 27 and increases from left to right. Attenuation in db (decibel) is measured along the abscissa 26 and starts at zero db and increases upward. Curve 28 is symmetrical about center frequency 29. Near the center frequency the attenuation is very low while as frequency increases in a positive or negative direction away from center frequency 29 the attenuation increases. Capacitor 20 in FIG. 1 causes the slope or skirts 30 of curve 28 to be steep. Without capacitor 20 skirts 30 would increase gradually as the distance from the center frequency 29 increases. Of course a filter having such a curve would not be very selective and therefore would not be suitable for most communications applications. Capacitor 19 causes curve 28 to be symmetrical about center frequency 29 and also decreases passband ripple. Accordingly, it is a cooperation between the capacitors of filter 10 which produce the symmetrical response curve 28 with minimum passband ripple.

The relationship between capacitor 19 and the other capacitors is:

$$C_{19} = \frac{2C_O C_C + C_O^2}{2C_A} \left\{ 1 + \sqrt{1 + \frac{8C_O^2 C_A C_C}{(2C_O C_C + C_O^2)^2}} \right\}$$

Where $C_{19}$ is capacitor 19, $C_O$ is capacitor 17, $C_C$ is capacitor 21 or 22 since both are of the same value, and $C_A$ is capacitor 20. All the capacitors are shown in FIG. 1 except for capacitor 17 which is shown in FIG. 2. This relationship of capacitor 19 produces a symmetrical bandpass about a center frequency and reduces the passband ripple.

FIG. 4 illustrates the cascading of three filter elements 10 to form a six pole, six zero filter. An input signal is coupled to input terminal 37. This input signal can be from the front end of a radio receiver or can be from a preceding IF amplifier stage or any other source where this filter would be used. Signal generator 35 and its output impedance represented by resistor 36 illustrate such signal sources. A first electrode of resonator or resonating element 11 is connected to input terminal 37 and is coupled to ground by capacitor 38. Capacitor 39 shunts the two top electrodes of the first resonating element 11. The two bottom electrodes are interconnected and coupled to ground by capacitor 41. An electrode of the second resonating portion of the first resonating element 11 is connected to a first electrode of a second resonating element 11 and is coupled to ground by capacitor 42. Capacitor 43 shunts the two top electrodes of the second resonating element 11. The two bottom electrodes are connected together and coupled to ground by capacitor 44. Coupling capacitor 46 is connected between the second and third resonating elements 11. A capacitor 47 shunts the two top electrodes of the third resonating element 11. The two bottom electrodes of the third resonating element 11 are interconnected together and coupled to ground by capacitor 48. Coupling capacitor 49 couples the output of the third resonating element 11 to ground. Output 51 is connected to a resistor 52 which represents an amplifier or some other portion of a communication system in which the filter illustrated in FIG. 4 would be used. The first and third resonating elements 11 have identical characteristics, such as, coupled bandwidth and resonating frequency. The second or center resonating element 11 has a resonating frequency which is slightly shifted from the other two resonating elements. This is standard practice in the use of monolithic crystal filter elements to obtain good passband characteristics. Because of the compact size of this filter and its response curve it is well suited for use as a single sideband filter for point to point modems and single sideband radios or any other filter application requiring very sharp skirt selectivity.

An eight pole, four zero filter having monolithic crystal filter elements is illustrated in FIG. 5. A signal source is illustrated by signal generator 56 and its impedance 57 which are connected to input terminals 58 and 59. Coupling capacitor 61 appears across input terminals 58 and 59. In this filter four resonating elements 11 are used. The two middle resonating elements 11 each having a shunting capacitor 63 and 67 respectively. Capacitor 64 couples the two lower electrodes of one of the center resonating elements 11 to terminal 59 while capacitor 68 couples electrodes of the other middle resonating element 11 to terminal 59. Coupling capacitor 62 is used between the first and second resonating elements 11, and coupling capacitor 66 is used between the second and third resonating elements 11 while coupling capacitor 69 is used between the third and fourth resonating elements 11. Coupling capacitor 71 appears across the output of the fourth resonating element 11. The output of the fourth resonating element 11 is connected to output terminals 72 and 73 which are coupled to an amplifier 75 by resistor 74.

An attenuation frequency response curve for the filter of FIG. 5 is illustrated in FIG. 6. Attenuation in db is shown along the abscissa 77 while the frequency in kilohertz is shown along the ordinate 78. The insertion loss of the filter approaches 0 db and the passband ripple is less than 0.2 db. The stopband characteristics are symmetrical with a 60 db bandwidth to 3 db bandwidth ratio of 1.44. Dips 81 and 82 are both above 70 db. Peaks 83 and 84 are symmetrical about center frequency 79.

The response curve of FIG. 6 was obtained by using the following value components in the filter of FIG. 5.

| Component Name & No. | Component Value |
| --- | --- |
| Resistor 57 | 1800 ohms |
| Capacitor 61 | 4 picofarads |
| Capacitor 62 | 24 picofarads |
| Capacitor 63 | 4.75 picofarads |
| Capacitor 64 | 30 picofarads |
| Capacitor 66 | 20 picofarads |
| Capacitor 67 | 4.75 picofarads |
| Capacitor 68 | 30 picofarads |
| Capacitor 69 | 24 picofarads |
| Capacitor 71 | 3 picofarads |
| Resistor 74 | 1800 ohms |

By now it should be appreciated that there has been provided a high order filter with symmetrical transmission zeros and low passband ripple. The high order filter requires only simple two pole symmetrical monolithic crystal filter elements and fixed capacitors. It will be appreciated that this approach eliminates the use of inductors in the filter. This filter gives minimum insertion loss and maximum temperature stability at a minimum cost. This filter is particularly suitable for use as single sideband filters for point to point modems, single sideband radios, and IF filters requiring very sharp skirt selectivity.

Consequently, while in accordance with the Patent Statutes, there has been described what at present are considered to be the preferred forms of the invention, it will be obvious to those skilled in the art that numerous changes and modifications may be made herein without departing from the spirit and scope of the invention, and it is therefore aimed in the following claims to cover all such modifications.

What is claimed is:

1. A filter for providing a symmetrical response about a given center frequency including a piezoelectric resonating element having first and second opposite sides with first and second pairs of electrodes thereon and the electrodes of each pair being on opposite sides of the resonating element, means coupled to the first pair of electrodes for applying signals thereto, means coupled to the second pair of electrodes for deriving selected signals therefrom, a first capacitor coupled between an electrode of the first pair located on the first side and a common terminal, a second capacitor coupled between an electrode of the second pair of electrodes located on the first side and said common terminal, a third capacitor coupled between the electrodes of the first and second pair of electrodes located on the first side, and a fourth capacitor coupled between both of the first and second electrodes located on the second side and said common terminal, the values of said first, second, third and fourth capacitors being selected to provide said predetermined response.

2. The filter of claim 1 wherein the fourth capacitor has a relationship as follows:

$$C_4 = \frac{2C_0C_C + C_0^2}{2C_3}\left\{1 + \sqrt{1 + \frac{8C_0^2C_3C_C}{(2C_0C_C + C_0^2)^2}}\right\}$$

where $C_4$ is the fourth capacitor, $C_O$ is a capacitance caused by the electrodes being on opposite sides of the resonating element, $C_C$ is the first or second capacitor since both capacitors are of equal value, and $C_3$ is the third capacitor.

3. A filter providing a symmetrical response about a given center frequency including a piezoelectric resonating element having first and second opposite sides with first and second electrodes on the first side and third and fourth electrodes on the second side wherein the first and third electrodes form a first pair of electrodes and the second and fourth electrodes form a second pair of electrodes, the first and second pairs being acoustically coupled together, means coupled to the first pair of electrodes of the resonating element for applying signals thereto, means coupled to the second pair of electrodes of the resonating element for deriving selected signals therefrom, first capacitor means coupled between the first electrode and a common terminal, second capacitor means coupled between the second electrode and a common terminal, third capacitor means coupled between the first and second electrodes, fourth capacitor means coupled between the third electrode and said common terminal, and the third and fourth electrodes being connected together, the values of said first, second, third and fourth capacitors being selected to provide said predetermined response.

4. The filter of claim 3 wherein the fourth capacitor means has a value expressed by:

$$C_4 = \frac{2C_0C_C + C_0^2}{2C_3}\left\{1 + \sqrt{1 + \frac{8C_0^2C_3C_C}{(2C_0C_C + C_0^2)^2}}\right\}$$

wherein $C_4$ is the fourth capacitor means, $C_O$ is a capacitance created by the pairs of electrodes and the resonating element, $C_C$ is the first or second capacitor means since both are of equal value, and $C_3$ is the third capacitor means.

5. A bandpass filter circuit for passing frequencies within a predetermined passband which includes first, second, and third resonators each having a first and second side and each having first and second resonating portions with a pair of electrodes wherein each pair of electrodes has a first electrode on the first side and a second electrode on the second side, input signal means having first and second terminals with the first terminal coupled to the first electrode of the first portion of the first resonator, first capacitor means coupled between the first and second terminals for receiving from the input signal means signals including signals which fall within the predetermined passband of the filter circuit, a second capacitor means coupled between the first electrodes on the first side of the first circuit, a third capacitor means coupled from the second electrodes on the second side of the first resonator to the second terminal, the first electrode of the second portion of the first resonator coupled to the first electrode of the first portion of the second resonator, a fourth capacitor means coupled from the first electrode of the second portion of the first resonator to the second terminal, a fifth capacitor means coupled between the first electrodes of the first and second portions of the second resonator, a sixth capacitor means coupled from the second electrodes on the second side of the second resonator to the second terminal, a seventh capacitor means coupled from the first terminal of the second portion of the second resonator to the second terminal, the first electrode of the second portion of the second resonator coupled to the first electrode of the first portion of the third resonator, an eighth capacitor means coupled between the first electrodes on the first side of the third resonator, a ninth capacitor means coupled from the second electrode on the second side of the third resonator to the second terminal, a tenth capacitor means coupled from the first electrode of the second portion of the third resonator to the second terminal, and means coupled to the second portion of the third resonator for receiving the signal translated through the filter circuit.

6. A filter circuit for passing a predetermined passband of frequencies and having first and second terminals for coupling to input signal means for applying signals including signals which fall within the predetermined passband of the filter circuit including first, second, third, and fourth resonators each having first and second opposite sides and each having first and second resonating portions with each resonating portion having a first electrode on the first side and a second electrode on the second side, the first electrode of the first portion of the first resonator coupled to the first terminal, first capacitor means coupled between the first and second terminals, the second electrodes of the first resonator coupled to the second terminal, second capacitor means coupled from the first electrode of the second portion of the first resonator to the second terminal, the first electrode of the second portion of the first resonator coupled to the first electrode of the first portion of the second resonator, third capacitor means coupled between the first electrodes of the second resonator, fourth capacitor means coupled from the second electrodes of the second resonator to the second terminal, fifth capacitor means coupled from the first electrode of the second portion of the second resonator to the second terminal, the first electrode of the second portion of the second resonator coupled to the first electrode of the first portion of the third resonator, sixth capacitor means coupled between the first electrodes of the third resonator, seventh capacitor means coupled to the second electrodes of the third resonator and the second terminal, eighth capacitor means coupled from the first electrode of the second portion of the third resonator to the second terminal, the first electrode of the second portion of the third resonator coupled to the first electrode of the first portion of the fourth resonator, the second electrodes of the fourth resonator coupled to the second terminal, ninth capacitor means coupled to the first electrode of the second portion of the fourth resonator and to the second terminal, and signal receiving means coupled to the second portion of the fourth resonator to receive signals within the predetermined passband of the filter circuit, the filter circuit thereby providing an eight pole, four zero filter.

7. A monolithic bandpass filter unit having an upper and a lower stopband comprising a monolithic piezoelectric substrate having two adjacent electrodes on one surface thereof constituting two bilateral terminals of said filter unit, and a common electrode on the other surface opposite said two electrodes, whereby the resulting structure acts as a pair of common resonators; predetermined coupling capacitance between said two adjacent electrodes; and a capacitor interconnecting said common electrode and a common terminal of said filter unit and adapted, in cooperation with said coupling capacitance, to introduce a pair of finite poles one in each of the stopbands of said filter unit.

8. The filter unit of claim 7, said common electrode constituted of two electrically interconnected conductive pads each of which is coextensive with the opposite bilateral electrodes.

9. The filter unit of claim 7, having predetermined capacitance between each of said bilateral terminals and said common terminal.

10. The filter unit of claim 8, having predetermined capacitance between each of said bilateral terminals and said common terminal.

11. A polylithic filter apparatus having an input and an output comprising a plurality of the filter units of claim 7, connected in tandem and having a predetermined capacitance connected in parallel at each tandem-connection junction, and having predetermined parallel capacitance in parallel with said input and said output.

12. A polylithic filtering apparatus having an input and an output comprising a plurality of the filter units of claim 8, connected in tandem and having a predetermined capacitance connected in parallel at each tandem-connection junction, and having predetermined parallel capacitance in parallel with said input and said output.

* * * * *